US006472251B1

(12) United States Patent
Myer et al.

(10) Patent No.: US 6,472,251 B1
(45) Date of Patent: Oct. 29, 2002

(54) METHOD FOR INTEGRATED CIRCUIT PACKAGING

(75) Inventors: Ronald D. Myer, Kokomo, IN (US); David J. Post, Carmel, IN (US); Bradley R. Knigga, Russiaville, IN (US); Paul C. Staab, Carmel, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/829,208

(22) Filed: Apr. 9, 2001

(51) Int. Cl.[7] ............................................... H01L 21/44
(52) U.S. Cl. ................ 438/123; 257/690; 257/692; 257/701; 83/56; 83/76
(58) Field of Search ........................ 257/692, 690, 257/701, 702, 703; 83/56, 76, 365, 675, 676

(56) References Cited

U.S. PATENT DOCUMENTS

| 5,307,240 | A | | 4/1994 | McMahon | 361/728 |
|---|---|---|---|---|---|
| 5,468,910 | A | | 11/1995 | Knapp et al. | 174/52.2 |
| 5,471,011 | A | | 11/1995 | Maslakow | 174/52.4 |
| 5,701,032 | A | | 12/1997 | Fischer et al. | 257/692 |
| 5,757,073 | A | | 5/1998 | Hoffmeyer | 257/700 |
| 5,949,132 | A | | 9/1999 | Libres et al. | 257/666 |
| 5,950,074 | A | | 9/1999 | Glenn et al. | 438/121 |
| 6,133,627 | A | * | 10/2000 | Khandros et al. | 257/692 |
| 6,182,546 | B1 | * | 2/2001 | Hecker et al. | 83/365 |

OTHER PUBLICATIONS

*Microchip Fabrication A Practical Guide to Semiconductor Processing*, Peter Van Zant, Chapter 18, pp. 549–585, McGraw–Hill 1997.

* cited by examiner

*Primary Examiner*—David Nelms
*Assistant Examiner*—Mai-Huong Tran
(74) *Attorney, Agent, or Firm*—Jimmy L. Funke

(57) ABSTRACT

A method of fabricating a microelectronic device package is provided. The method includes a continuous processing mode of microelectronic device packages wherein process steps for fabricating the microelectronic device package are performed resulting in savings from the removal of more expensive batch processing steps.

18 Claims, 6 Drawing Sheets

METHOD FOR INTEGRATED CIRCUIT PACKAGING

FIELD OF THE INVENTION

The present invention relates to methods for fabricating packages for microelectronic devices.

BACKGROUND OF THE INVENTION

In the electronic industry, it is conventional to encapsulate microelectronic devices such as integrated circuits in chip carrier packages or overmolded packages. These packages protect the microelectronic device from the environment, and provide means for electrically and mechanically attaching the microelectronic device in the intended system.

The conventional technique for forming these packages comprises transfer molding. The leadframes are separated into sections for a predetermined number of packages, and microelectronic devices are attached to the leadframes. Transfer molding is a batch process that has been used in the electronics industry for many years, where leadframes are transferred to a molding machine, a mold cavity is formed around the leadframe and device, and plastic is injected into the mold to form the package.

Subsequently, chip carrier type packages can be filled with an encapsulant and then sealed. The leads for plastic packages are then plated. This entails a complex set of processes which can be incompatible with other packaging process steps, and therefore requires more careful and expensive treatment to prevent damage to the sealed package.

Additionally, in conventional molding of plastic packages, when the mold is closed around the leadframe, there are spaces between the leads from which the plastic can leak from the mold. In order to prevent this, a section of the leadframe called a dambar acts as a dam to prevent the leakage of plastic. After the plastic package has been set and cured, the dambars are cut away with a series of precision cutting tools. This is conventionally done at the stage when the packages, typically in strip form, are subsequently separated into individual packages. These cutting tools are expensive because of the need for precision and tight tolerances in the microelectronic devices.

Despite these disadvantages, it is desirable to create a die package for a semiconductor device which is essentially a molded package. This is because a molded package is sturdy and cost effective. Additionally, the electronic industry is accustomed to the molded package in that the product design and assembly processes are set up to use molded die packages. It would be advantageous to have improved methods for forming the plastic packages.

SUMMARY OF THE INVENTION

In one aspect, this invention provides a method of forming microelectronic packages of the type including a microelectronic device, a receptacle formed of an insulative material and defining a cavity for receipt of the microelectronic device, and a leadframe formed of a conductive material and facilitating electrical and mechanical connection of the microelectronic device to an external circuit.

According to the invention, the packages are formed in a continuous process comprising: moving a continuous strip of an electrically conductive substrate material along a feed path to a removal station and removing material from the continuous strip to define a series of successive connected leadframes from the remaining material with each leadframe including a series of leads; at a forming station along the feed path, forming a receptacle of electrically insulative material on the substrate strip at a respective leadframe, and attaching a device in the cavity at an attachment station. As such, a continuous strip of successively connected cavity packages, each containing a device are formed. This method has the advantage of providing a continuous production of packages resulting in a savings of fabrication time and material.

Another aspect of the invention is to include one or more additional processing steps along the feed path. The process can be extended to include: a wire bonding step whereby the microelectronic device is electrically connected to the leads via a plurality of wires; a liquid fill station where each cavity is filled with a liquid encapsulant; a curing station for setting the liquid encapsulant; a sealing station for sealing the package with a lid; a marking station for labeling each package; and a separation station for the separation of the continuous strip of packages into discrete strips containing a desired number of packages. The continuous process of the invention facilitates selected addition of the recited steps depending upon the requirements of a particular package design or the availability of particular production equipment.

Other objects, advantages and applications of the present invention will become apparent to those skilled in the art when the following description of the best mode contemplated for practicing the invention is read in conjunction with the accompanying drawings.

BRIEF DESCRIPTION OF THE DRAWINGS

These and other features, aspects, and advantages of the present invention will become apparent with reference to the following description, appended claims, and accompanying drawings where:

DESCRIPTION OF THE PREFERRED EMBODIMENTS

The present invention provides a new method for producing microelectronic device packages. Such microelectronic device packages are preferably formed of a hard, durable material and encapsulate the microelectronic device.

Figure 1:
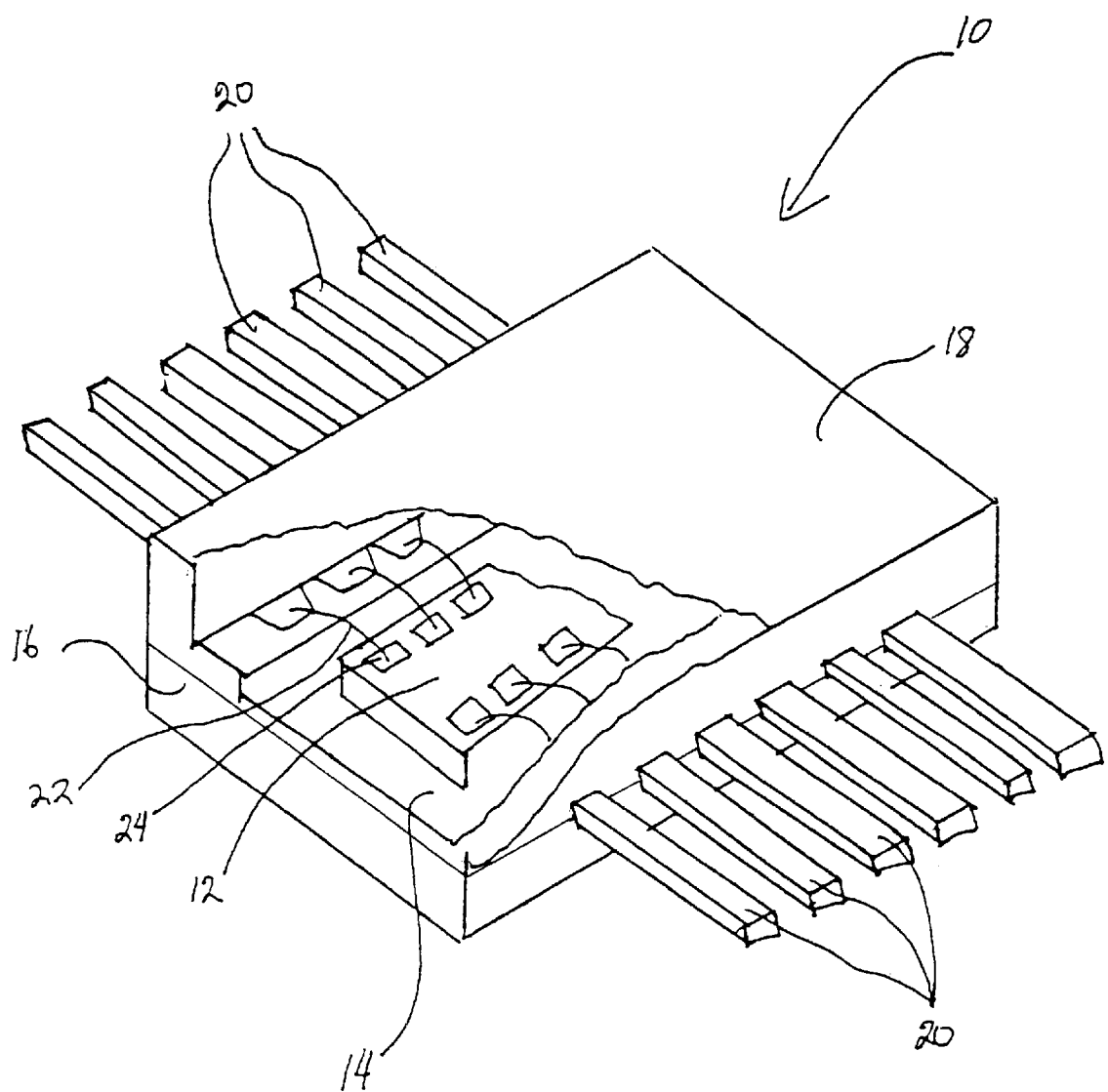
FIG. 1 is a cutaway view of a package with a microelectronic device therein.
Figure 2:
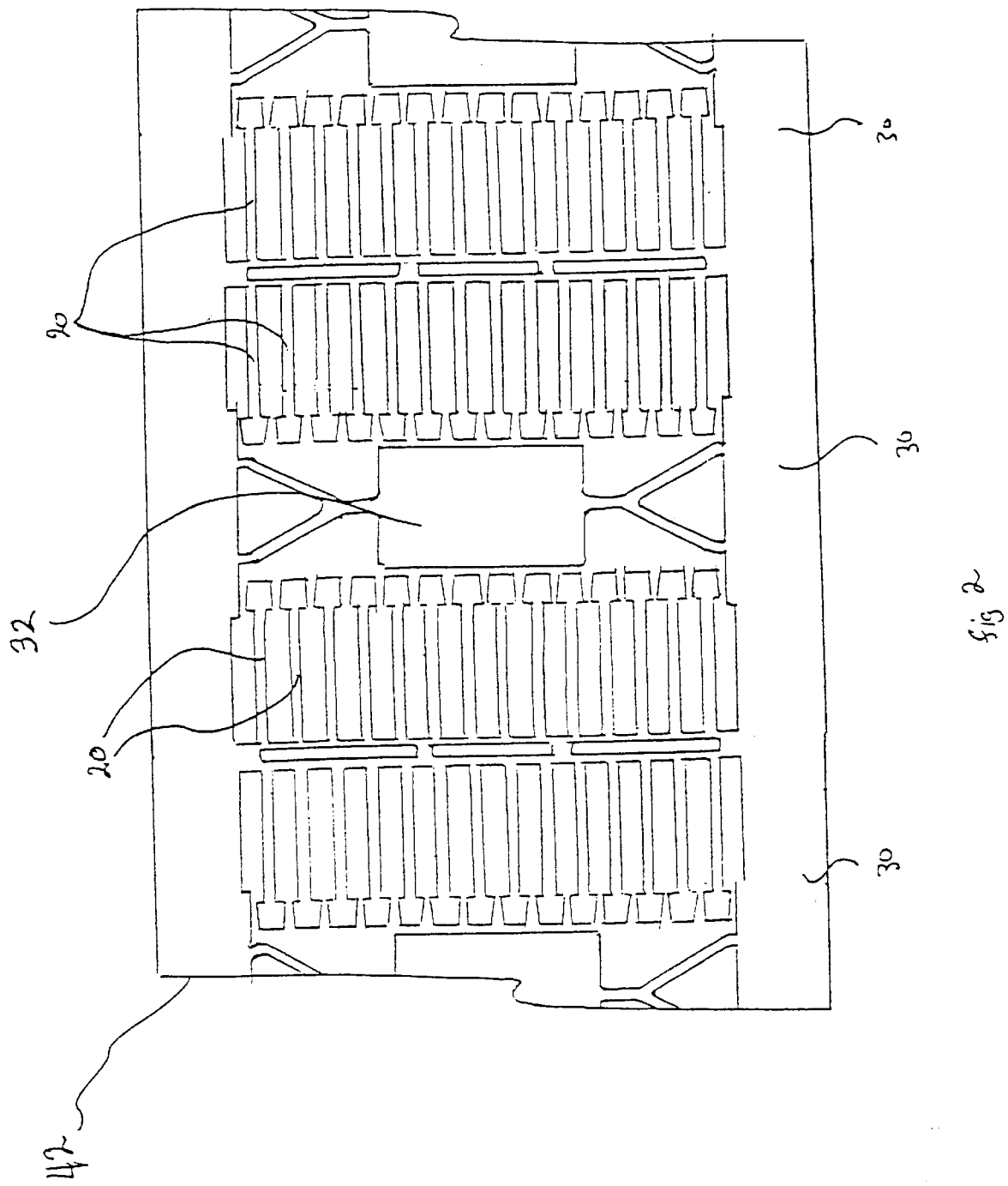
FIG. 2 is a diagram of a section the strip of metal including leadframes after etching.

For purpose of background, a typical package for a microelectronic device will be described. FIG. 1 depicts a cutaway view of a package 10 which includes a microelectronic device 12. The microelectronic device 12 may comprise, e.g., an integrated circuit or "chip." The microelectronic device 12 is positioned in a cavity 14 defined by a receptacle 16 which is covered by a lid 18. A plurality of leads 20 extend through a wall of the receptacle 16 and into the cavity, a further plurality of leads 20 extend through an opposite wall of the receptacle and into the opposite side of the cavity. The device 12 is connected to the leads 20 by thin wires 22. The wires 22 are bonded to the microelectronic device at bonding pads 24 on the microelectronic device. Leads 20 facilitate electrical connection of the device 12 to an external circuit. The leads 20 are provided by leadframes 30, FIG. 2, and are strips of metal that have been etched or stamped, such that the remaining material defines the leads 20 and a die pad 32 positioned between the opposing leads 20.

Conventionally, the leadframes are produced in strip form, then cut into discrete sections for fabrication of packages by batch processing.

Figure 3:
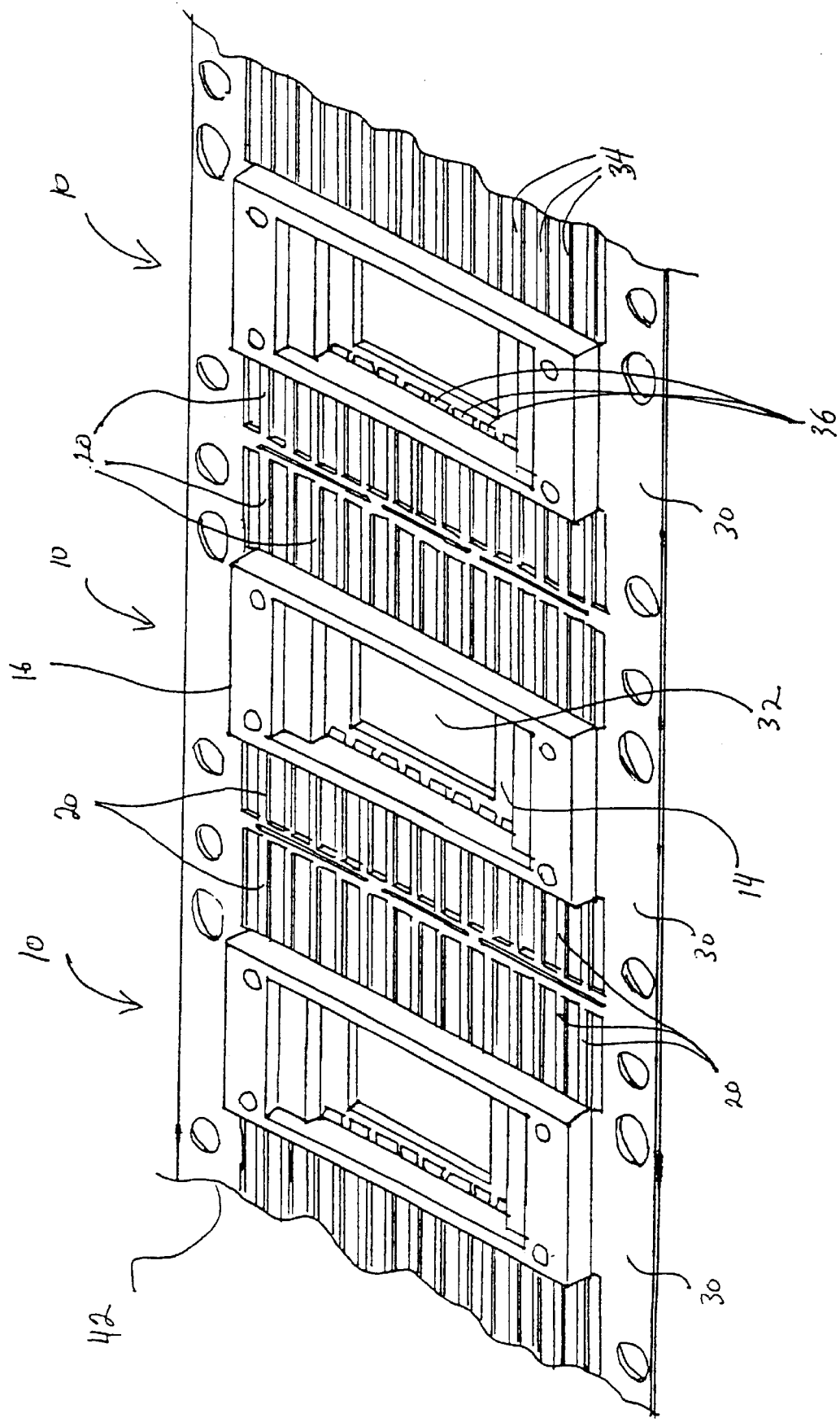
FIG. 3 is a diagram of packages during a stage of fabrication.

According to the invention, the package die is produced in a continuous manufacturing process. FIG. 3 depicts a diagram of a strip of packages 10 during a stage in the continuing manufacturing process. Each package includes the receptacle 16 for receiving the device, as well as a leadframe 30 which provides the leads 20 in the finished package providing connections to an external circuit. The leadframes are fabricated from a continuous strip of metal 42, typically copper (Cu). The leadframe is formed from the strip 42 by cutting or etching to a desired configuration, where material is cut away leaving the leads 20. The receptacle 16 is fabricated from a thermoplastic and defines a cavity 14 for receiving a microelectronic device. Leads 20 include an exterior portion 34 which extends through the sides of the receptacle 16 to an interior portion 36 having a paddle configuration and positioned within the cavity. The package may also include metal die pad 32 fabricated during the production of the leadframes from the strip 42. The die pad 32 is positioned in the cavity 14.

Figure 4:
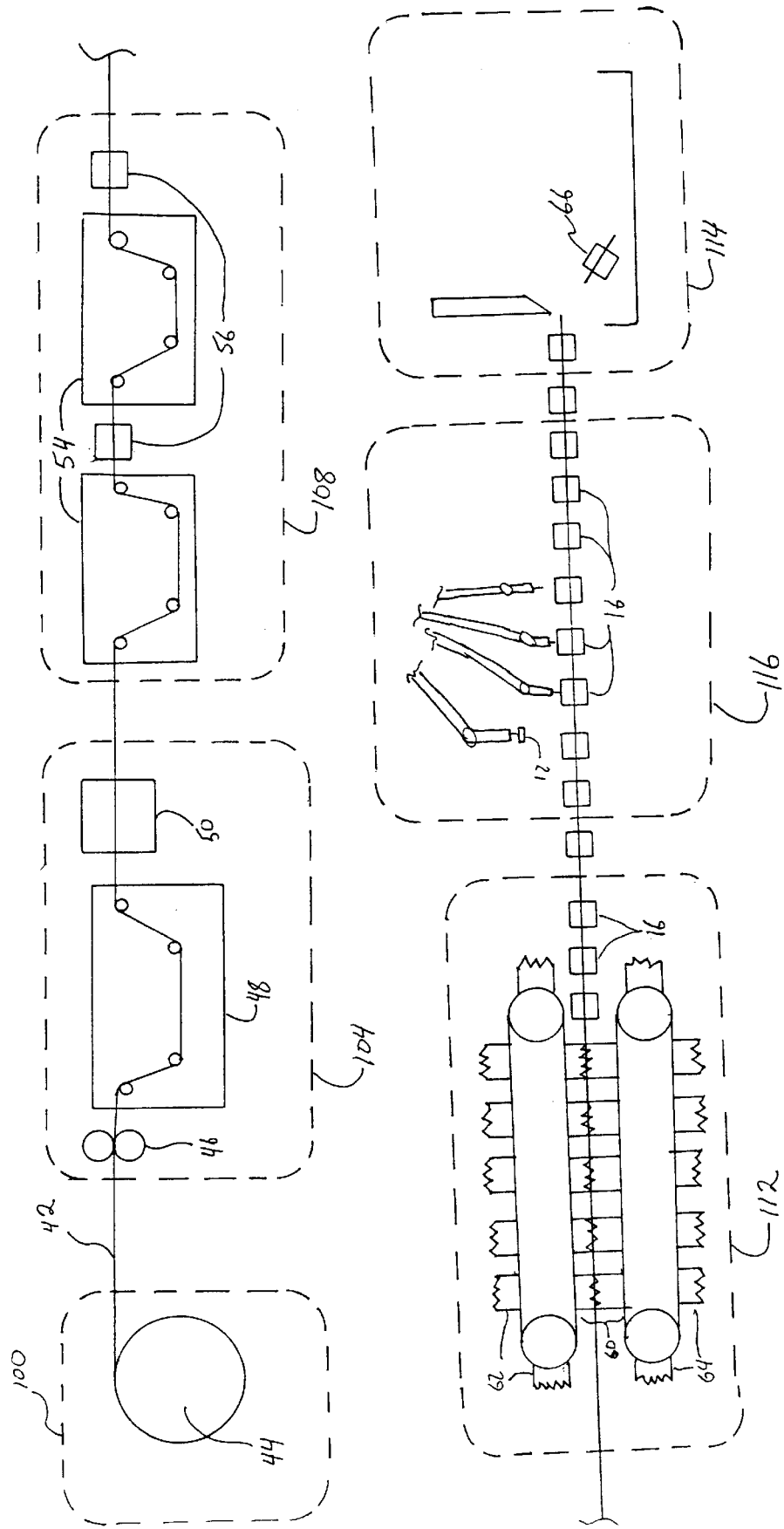
FIG. 4 is a diagram of the process for production of the packages of FIGS. 1 and 3.

FIG. 4 is the overall diagrammatic view of the continuous process of the invention. The continuous copper strip 42 of electrically conductive substrate begins at a supply station 100 where the strip is supplied from a reel 44.

The continuous strip 42 proceeds to a removal station 104 where the continuous strip 42 is etched to create a series of successive connected leadframes. The removal station includes a resist section 46 for applying a resist to the strip 42 in a desired pattern, an etching bath 48 for removal of the material on the continuous strip 42 not covered by the resist, and a rinse section 50 for removing the resist and any residual etchant, thus forming a continuous strip of connected leadframes 30.

The strip 42, now in the form of a continuous strip of connected leadframes 30, continues to a plating section 108 where the strip 42 proceeds through a series of plating baths 54 and rinsing baths 56. The continuous strip of leadframes is plated in a first plating bath containing a nickel (Ni) solution. The first plating bath deposits a layer of nickel on the copper leadframes 30. The continuous strip of leadframes is rinsed and proceeds through a second plating bath. The second plating bath contains a palladium (Pd) solution and deposits a layer of palladium over the nickel layer on the continuous strip of leadframes. The continuous strip of leadframes is rinsed and proceeds through a third plating bath (not shown). The third plating bath contains a gold (Au) solution and deposits a layer of gold over the palladium layer. The leadframes are rinsed and proceed to the next station.

Figure 5:
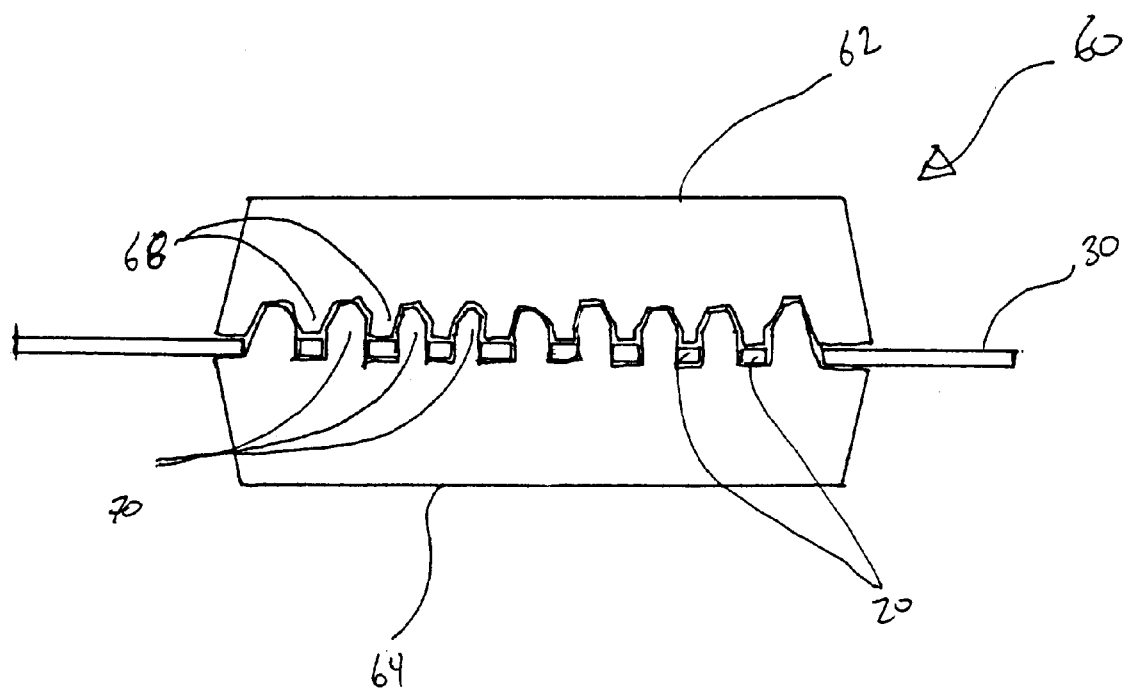
FIG. 5 is a diagram of the mold housing attached to a leadframe.

The continuous strip 42 proceeds to a receptacle formation station 112. The receptacle formation is performed with thermoplastic injection molding that forms a receptacle integral with each leadframe. A mold housing 60, FIG. 5, is used for fabricating the receptacle in a continuous thermoplastic injection molding process. The mold housing 60 has an upper and lower part that engage on the leadframe. The mold housing 60 includes two parts, an "A" side part 62 and a "B" side part 64. The mold housing B side part 64 has teeth 70 that are tapered and fit between the leads 20 on the leadframe 30. The teeth 70 are tapered and help guide the leadframe 30 into a correct position. The moldhousing A side part 62 has teeth 68 that are shaped to mesh with the teeth 70 of the B side part 64. The teeth 68 of the A side part 62 are designed to leave a gap where the leads 20 from the leadframe sit. The tapered teeth 68, 70 help close the mold 60 and provide a sufficient seal to prevent plastic from leaking out of the mold 60. The mold housing has two sets of offset steel teeth 68, 70 that protrude into the spaces between the leads 20, come together and seal the spaces between the leads 20. The design permits the fabrication of dambarless leadframes. Creating receptacles without dambars eliminates expensive dambar removal steps. Thermoplastic is injected and fills the mold housing 60 to create the receptacle 16, such that the receptacle defines a cavity 14 and encapsulates each leadframe 30, wherein the leads 20 extend from the cavity 14 to the exterior of the receptacle 16. The thermoplastic sets and the mold housing is automatically removed. The receptacle 16 is fabricated from a thermoplastic, and a preferred plastic is a liquid crystal polymer (LCP) material. A variety of plastics are available for use with this process, among them are polyimides.

The continuous strip of receptacles 16 proceeds to a device attachment station 116. At the attachment station 116, microelectronic devices 12 are placed in the receptacles 16. An adhesive is applied to the device 12, or the die pad 32, or both prior to insertion of the device 12 into the receptacle 16.

Following the receptacle formation and attachment of the microelectronic device, the continuous strip of leadframes proceeds to the separation station 114, and then the continuous strip of leadframes is cut into discrete sections 66 containing a desired number of packages.

In one process alternative, the leadframe can be another electrically conductive material, such as aluminum (Al).

In another process alternative, the substrate is stamped to define the desired leadframe features. The choice of stamping or etching will depend on the thickness of the substrate as well as other features of a particular fabrication design.

In another process alternative, the choice, order, and number of plating baths 54 will depend on the end use, and the type of metal used for wires 22. Factors influencing the choice of plating material include corrosion resistance and solderability.

Figure 6:
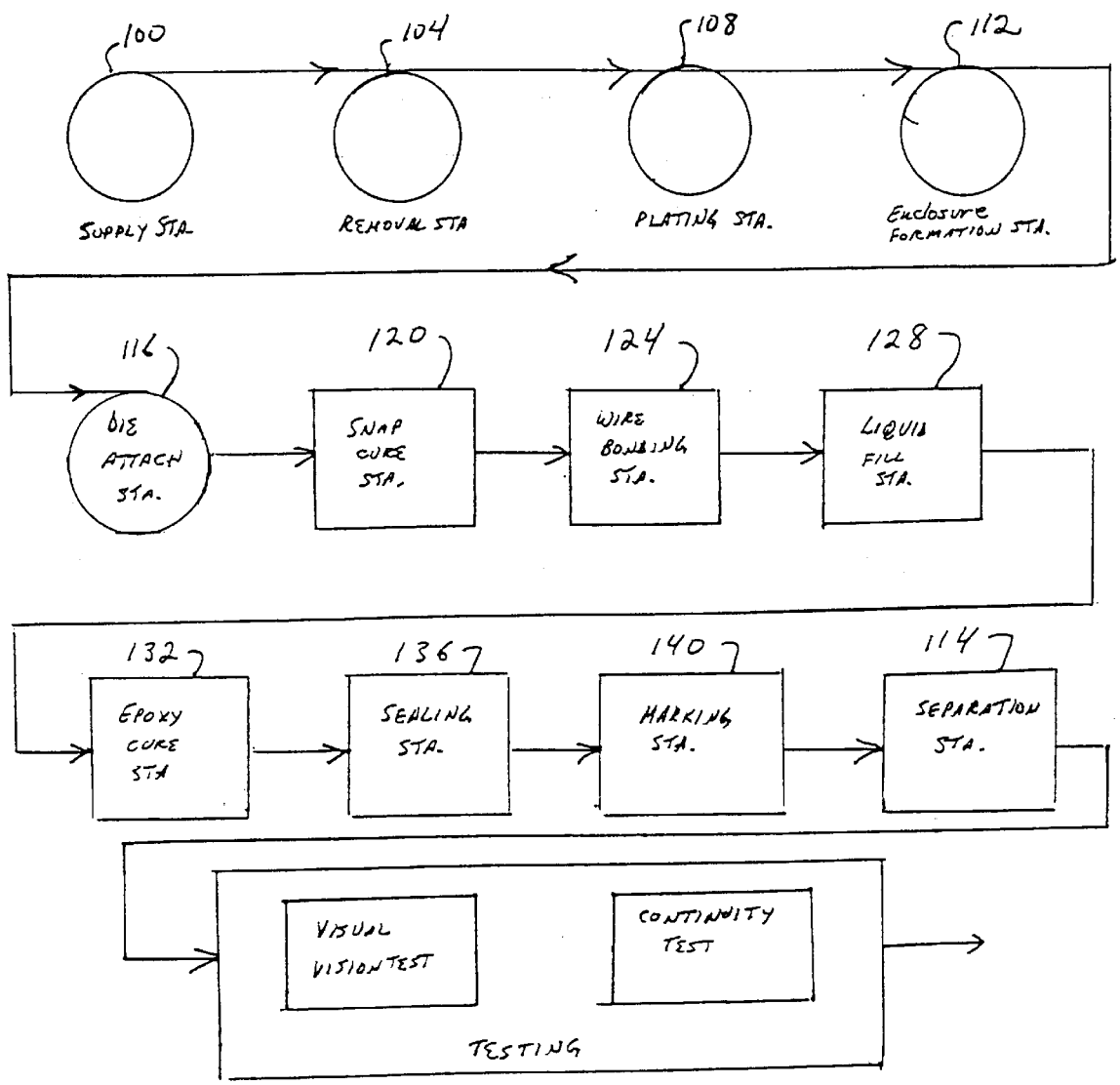
FIG. 6 is a process flow chart for production of the packages of FIGS. 1 and 3.

The continuous processing feature of the present invention may also include additional steps in the fabrication of packages prior to separation. In the expanded process of FIG. 6, the process commences with the supply of a continuous strip of substrate from the supply station 100, proceeds to the removal station 104, the plating station 108, the receptacle formation station 112, the device attachment station 116, and then continues to a wire bonding station 124. At the die attachment station 116, an adhesive is applied to either the die pad 32 in each receptacle 16, or the microelectronic device 12, or both. A microelectronic device 12 is positioned and attached to each die pad 32 in each receptacle 16 on the continuous strip. The choice of adhesive depends on the particular device and its intended function. Factors affecting the choice of adhesive are whether the device needs to be insulated from the environment, or thermally or electrically connected to an external environment. Typical adhesives selected for microelectronic applications are silver-filled epoxy and silver-filled polyimide.

The continuous strip of packages 10 thereafter proceeds to a snap cure station 120 where the adhesive is cured in an oven. An aspect of this automation is curing in a pass-through oven.

At the wire bonding station 124, each device 12 is electrically connected to the inner portion 36 of the leads 20 in the corresponding package 10 on the continuous strip 42 via a plurality of wires 22. Wires are affixed by conventional wire bonding techniques. These include aluminum wire bonding through ultrasonic bonding, or gold wire bonding through thermosonic or thermocompression bonding methods.

The continuous strip of packages thereafter proceeds to a liquid fill station 128 where each package 10 is filled with an encapsulating liquid which may be either a liquid epoxy or a silicone gel filling material. The choice of fill material depends on the characteristics of the die. In an alternative, the continuous strip of packages 10 remains unfilled as may be desired in the case where the microelectronic device comprises a pressure sensor. An aspect of this invention is the application to making sensor device packages. Sensor device packages are not able to be made with the conventional method of attaching the devices and overmolding the device and leadframe, and therefore require more costly and time consuming processing.

The continuous strip of packages 10 thereafter proceeds to an epoxy cure station 132 where the adhesive is cured in an oven. An aspect of this automation is curing in a pass-through oven.

The continuous strip of packages 10 thereafter proceeds to a sealing station 136 where a protective lid 18 is affixed to each package using a polyimide adhesive. The choice of adhesive will depend on the choice of thermoplastic used for the receptacle. The lid material is typically a dark plastic material suitable for marking with a laser.

The continuous strip of packages 10 thereafter proceeds to a laser marking station 140 where each package is marked with information as desired to identify the encapsulated microelectronic device therein.

The continuous strip of packages then proceeds to the separation station 114 for separation from the continuous strip into individual packages, or into strips containing a desired number of packages.

When different stations require different speeds, known processes for matching the different speeds of the different stations are applied. One such method entails the use of multiple substations along the continuous strip, such as using several device attachment substations. In addition, between each process station, a buffer area is provided for creating and taking up slack in the continuous strip. The buffer area includes a series of reels that have springs and guides to provide a constant tension and allow movement of the reels as slack is either created or taken up.

The metal die pad 32 may be encapsulated with the thermoplastic material of the receptacle or, alternatively, may be exposed to the external environment in which case a heat source may be applied to the metal die pad for transfer of heat through the die pad 32 and the device 12 to the bonding pads 24 on the device 12. Heating the bonding pads 24 is necessary in the case of gold wire bonding. The exposed metal die pad 32 may also be affixed to a heat sink. This enhances thermal management of the package and the device contained therein.

An important feature of this invention is the ability to select the desired stations in the production process. This invention can be applied for the expansion of existing package manufacturing systems bringing stations on-line as equipment becomes available.

The operation and construction of the system for the continuous fabrication of microelectronic die packages is apparent from the foregoing description. The method of operation and structure of the system described has been characterized as being preferred. Obvious changes and modifications may be made therein and it is not intended that it be limited to the above description, but rather only to the extent set forth in the following claims.

What is claimed is:

1. A method of forming microelectronic packages of the type including a microelectronic device, a receptacle formed of an insulative material and defining a cavity for receipt of the microelectronic device, and a leadframe formed of a conductive material and facilitating electrical connection of the microelectronic device to an external circuit, characterized in that the packages are formed in a continuous process comprising:

moving a continuous strip of an electrically conductive substrate material along a feed path;

at a removal station along the feed path, the step of removing material from the continuous strip to define a series of successive connected leadframes from the remaining material with each leadframe including a series of leads; and at a forming station along the feed path, spaced downstream from the removal station, the step of forming a receptacle of electrically insulative material on the substrate strip at a respective leadframe, with each receptacle defining a cavity for receipt of a microelectronic device and with each receptacle formed integral with the respective leadframe, such that the leads of the leadframe extend from the cavity to the exterior of the receptacle to facilitate electrical connection of the microelectronic device to an external circuit; and at an attachment station, the step of placing a microelectronic device in the receptacle.

2. The method of claim 1 comprising the further step of plating the continuous strip of substrate.

3. The method of claim 2 wherein the step of plating the continuous strip of substrate is performed before the forming step.

4. The method of claim 3 wherein the step of plating comprises a plurality of plating steps.

5. The method of claim 1 comprising the further step of bonding wires from the microelectronic device to the leads positioned within the cavity.

6. The method of claim 5 comprising the further step of filling the cavity with a liquid to encapsulate the device within the cavity.

7. The method of claim 6 comprising the further step of covering the receptacle with a lid.

8. The method of claim 7 comprising the further step of marking the package.

9. The method of claim 8 comprising the further step of plating the leads.

10. The method of claim 9 wherein the step of plating comprises a plurality of plating steps.

11. The method of claim 8 comprising the step of separating the continuous strip into discrete sections containing one or more packages.

12. The method of claim 1 wherein the removal step comprises the application of a resist, and the subsequent immersion into an etchant bath.

13. The method of claim 1 comprising the further step of separating the continuous strip into discrete sections containing one or more packages.

14. A method of forming microelectronic packages comprising:
- moving a continuous strip of an electrically conductive substrate material along a feed path;
- removing material from the continuous strip to define a series of successive connected leadframes from the remaining material with each leadframe including a series of leads;
- forming a receptacle of electrically insulative material on the substrate strip proximate each successive leadframe, with each receptacle defining a cavity for receipt of a microelectronic device, and with each receptacle encapsulating the respective leadframe such that the leads of the leadframe extend from the cavity to the exterior of the receptacle to facilitate electrical connection of the microelectronic device to an external circuit; and
- attaching a microelectronic in the receptacle.

15. The method of claim 14 comprising the further step of plating the continuous strip of substrate.

16. The method of claim 15 wherein the further step of plating comprises a plurality of plating steps.

17. The method of claim 14 comprising the further step of separating the continuous strip into discrete sections containing one or more receptacles.

18. A method of forming microelectronic packages of the type including a microelectronic device, a receptacle formed of an insulative material and defining a cavity for receipt of the microelectronic device, and a leadframe formed of a conductive material and facilitating electrical connection of the microelectronic device to an external circuit, characterized in that the packages are formed in a continuous process comprising:
- moving a continuous strip of an electrically conductive substrate material along a feed path;
- at a removal station along the feed path, removing material from the continuous strip to define a series of successive connected leadframes from the remaining material with each leadframe including a series of leads;
- at a forming station along the feed path downstream from the removal station, forming a receptacle of electrically insulative material on the substrate strip proximate each successive leadframe with each receptacle defining a cavity for receipt of a microelectronic device, and with each receptacle encapsulating the respective leadframe such that the leads of the leadframe extend from the cavity to the exterior of the receptacle to facilitate electrical connection of the microelectronic device to an external circuit;
- at a plating station along the feed path, plating the continuous strip of substrate in one or more plating baths;
- at a device attachment station along the feed path, securing a microelectronic device within each cavity;
- at a connection station along the feed path, electrically connecting the microelectronic device to the leads positioned within the cavity of each package;
- at a liquid fill station along the feed path, filling each cavity with a liquid encapsulant;
- at a curing station along the feed path, curing the liquid encapsulant;
- at a sealing station along the feed path, covering each package with a lid to seal each package;
- at a marking station along the feed path, marking each package; and
- at a separation station along the feed path, separating the continuous strip into discrete sections containing one or more packages.

* * * * *